(12) United States Patent
Shigeno et al.

(10) Patent No.: US 6,372,625 B1
(45) Date of Patent: *Apr. 16, 2002

(54) SEMICONDUCTOR DEVICE HAVING BONDING WIRE SPACED FROM SEMICONDUCTOR CHIP

(75) Inventors: Takashi Shigeno; Osamu Isaki, both of Osaka (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/138,616

(22) Filed: Aug. 24, 1998

(30) Foreign Application Priority Data

Aug. 26, 1997 (JP) ................................. 9-229509

(51) Int. Cl.⁷ ..................... H01L 21/44; H01L 21/48; H01L 21/50; H01L 23/48; H01L 23/52
(52) U.S. Cl. ..................... 438/617; 438/123; 257/784; 257/666
(58) Field of Search .................. 257/666, 678, 257/696, 676, 684, 784; 438/111, 123, 110, 121, 130, 617, 611, 612; 228/102

(56) References Cited

U.S. PATENT DOCUMENTS

| 5,148,964 A | * | 9/1992 | Shimizu | 228/102 |
|---|---|---|---|---|
| 5,150,828 A | * | 9/1992 | Shimizu | 228/102 |
| 5,205,463 A | * | 4/1993 | Holdgrafer et al. | 228/102 |
| 5,710,457 A | * | 1/1998 | Uno | 257/666 |
| 5,717,252 A | * | 2/1998 | Nakashima et al. | 257/707 |
| 5,803,246 A | * | 9/1998 | Kitamura et al. | 206/204 |
| 5,872,338 A | * | 2/1999 | Lan et al. | 174/255 |
| 5,898,225 A | * | 4/1999 | Choi | 257/784 |

FOREIGN PATENT DOCUMENTS

JP          4-147661       *  5/1992

* cited by examiner

*Primary Examiner*—George Fourson
*Assistant Examiner*—Neal Berezny
(74) *Attorney, Agent, or Firm*—Wenderoth, Lind & Ponack, L.L.P.

(57) ABSTRACT

A semiconductor device has a semiconductor chip fixedly mounted on an island and a bonding wire connecting a bonding pad on the semiconductor chip to a lead terminal whose end is positioned near the island. The semiconductor chip and the bonding wire are encased by a molded resin. The bonding wire includes a first extension ascending substantially vertically from the bonding pad, a second extension extending substantially horizontally from the first extension, and a third extension descending substantially vertically from the second extension. A bend between the second and third extensions is disposed outwardly of an end of the semiconductor chip.

6 Claims, 7 Drawing Sheets

FIG. 1 - PRIOR ART
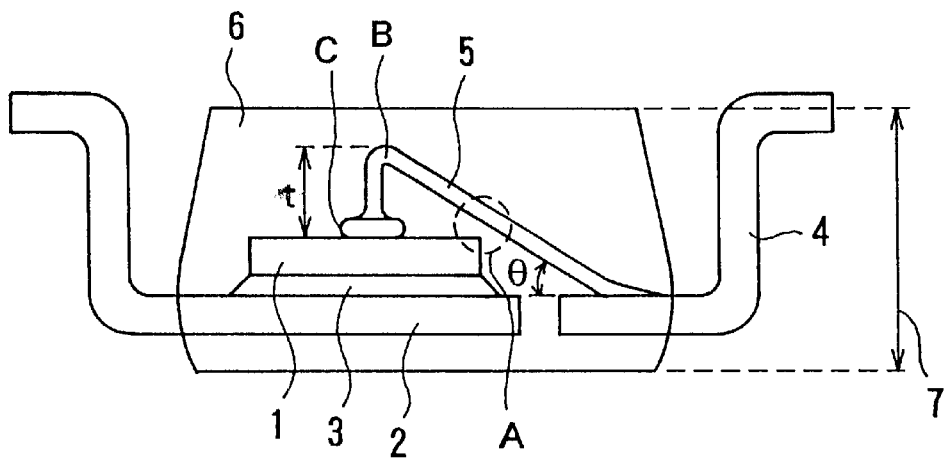
FIG. 2
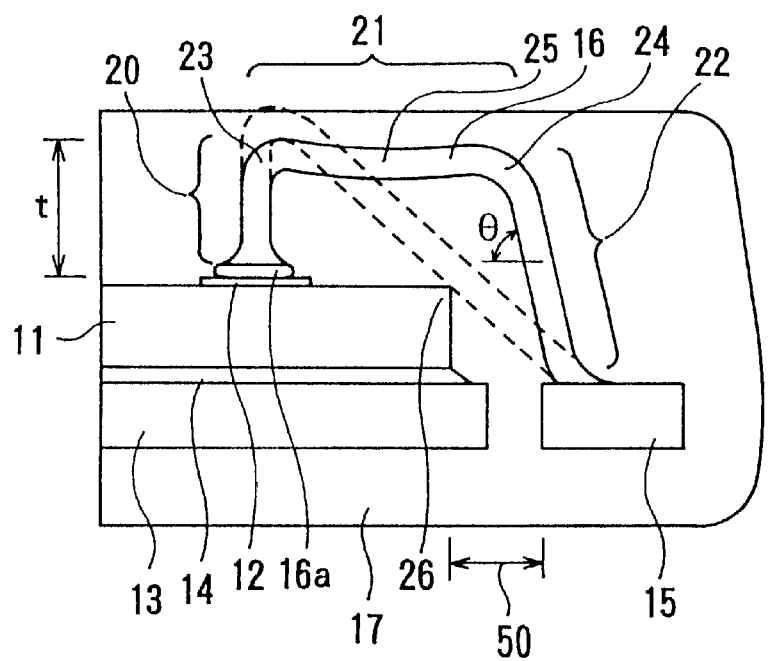

F I G. 5
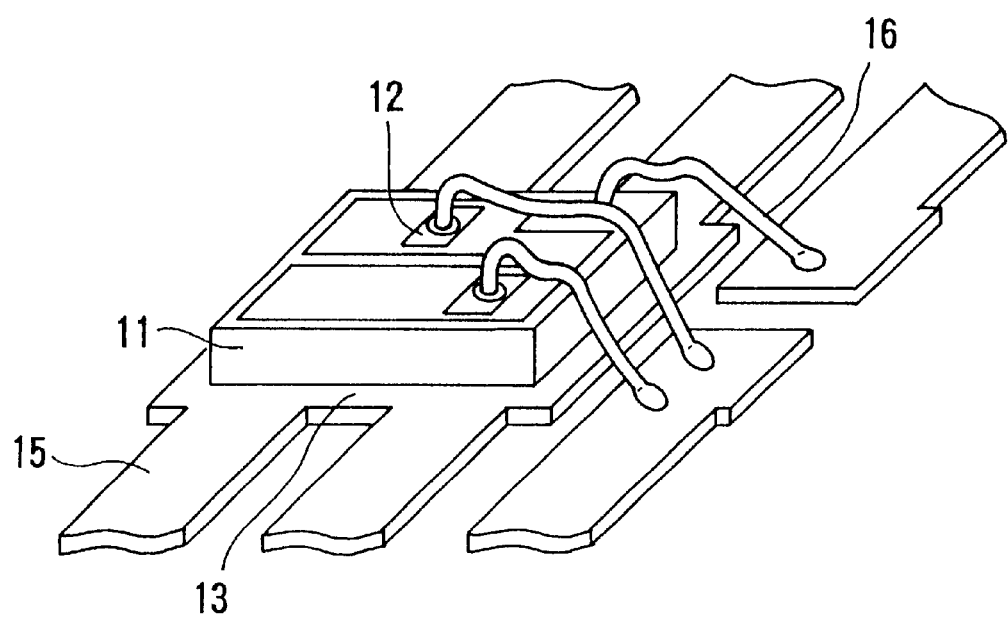

FIG. 6A - PRIOR ART
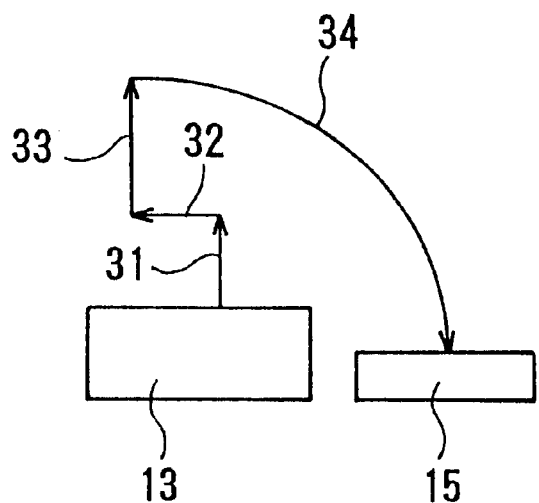
FIG. 6B
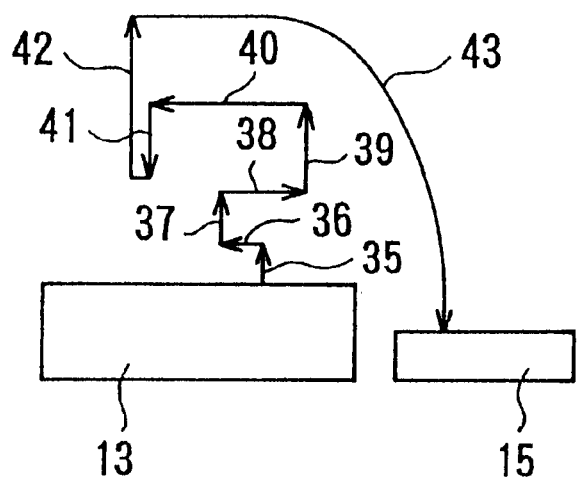

FIG. 7A - PRIOR ART
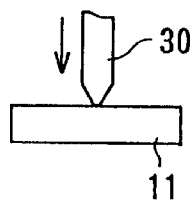
FIG. 7B - PRIOR ART
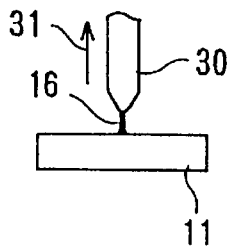
FIG. 7C - PRIOR ART
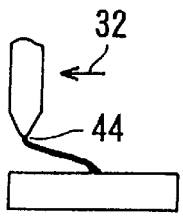
FIG. 7D - PRIOR ART
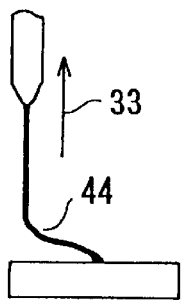
FIG. 7E - PRIOR ART
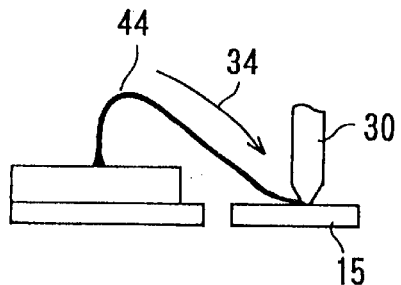

SEMICONDUCTOR DEVICE HAVING BONDING WIRE SPACED FROM SEMICONDUCTOR CHIP

BACKGROUND OF THE INVENTION

1. Field of the Invention

The present invention relates to a semiconductor device having a semiconductor chip accommodated in a package.

2. Description of the Related Art

Generally, packages for semiconductor devices are not newly designed as being uniquely manufactured for certain semiconductor device configurations, but are manufactured beforehand in several sizes and shapes according to certain classifications and standards. When a semiconductor device is manufactured, a package which has the number of pins and the bent lead shape that are suitable for the type and current capacity of a semiconductor chip to be accommodated is selected from among the available packages, and the semiconductor chip is placed in the selected package.

FIG. 1 of the accompanying drawings shows a discrete semiconductor device with a small-size SMT (Surface Mount Type) package. The discrete semiconductor device shown in FIG. 1 is manufactured as follows: A semiconductor chip 1 is mounted on an island 2 of a lead frame by an adhesive according to die bonding. A bonding pad of the semiconductor chip 1 is connected to lead terminals 4 by bonding wires 5 according to bonding wire bonding. The lead frame is then set in a mold whose mold cavity has a desired shape, after which an epoxy resin is injected into the mold cavity. When the epoxy resin is solidified, the lead frame and the semiconductor chip 1 are encased by an epoxy resin body 6. The lead terminals 4 extending out of the epoxy resin body 6 are bent into a Z shape for a surface mount application.

Efforts are being made to reduce the size and increase the capacity of the illustrated discrete semiconductor device. Consequently, there is a demand for mounting larger semiconductor chips in packages of the same size.

The maximum size of a semiconductor chip that can be accommodated in a package is mainly governed by the area of the island 2 of the lead frame. The area of the island 2 depends on the outer dimensions of the semiconductor device minus a removal clearance required for the island 2 and the lead terminals 4 and the thickness of a layer between the loop of the bonding wires 5 and the upper surface of the epoxy resin body 6. The area of the island 2 is also limited by a loop height t of the bonding wires 5. For these reasons, certain difficulties are encountered in mounting larger semiconductor chips in packages of the same size.

In FIG. 1, the bonding wires 5 are connected by a first bond to the bonding pad on the semiconductor chip 1, then shaped into a loop by a capillary tool, and finally connected by a second bond to the lead terminals 4. The bonding wires 5 thus bonded electrically interconnect the semiconductor chip 1 and the lead terminals 4 through the loop having the loop height t. In order to reduce a thickness 7 of the semiconductor device, it is necessary to reduce the loop height t. When the loop height t is reduced, however, the angle 0 of the bonding wires 5 with respect to the lead terminals 4 is also reduced. If the size of the semiconductor chip 1 were increased under such a limitation, then a corner of the semiconductor chip 1 would be brought into contact with the bonding wires 5 at a region A, resulting in an electric short circuit.

Because of the above limitation imposed by the bonding wires 5 in addition to the dependency on the area of the island 2, it is impossible to accommodate semiconductor chips whose sizes are greater than a certain size in the package.

Furthermore, if the bonding wires 5 are increased in diameter because of an increase needed in the current capacity of the semiconductor chip 1, then since the mechanical strength of the bonding wires 5 increases, the curvature of the bonding wires 5 has to increase in a region B. Since the increase in the curvature of the bonding wires 5 results in an increase in the loop height t, there is a certain limitation on increasing the diameter of the bonding wires 5. If the curvature of the bonding wires 5 were excessively large, then the bonding wires 5 would tend to be detached from the semiconductor chip 1 in a region C.

For example, when the diameter of the bonding wires 5 increases from $20\mu$ to $60\mu$, the loop height t increases by the diameter difference of $20\mu$ to $40\mu$ even if the bonding wires 5 are shaped into the same loop.

SUMMARY OF THE INVENTION

It is therefore an object of the present invention to provide a semiconductor device which allows a larger semiconductor chip to be mounted in a package of the usual size.

Another object of the present invention is to provide a semiconductor device which includes bonding wires bent at relatively large angles to prevent their loops from being positioned at an unwanted height when the bonding wires have a relatively large diameter.

According to the present invention, there is provided a semiconductor device comprising an island, a semiconductor chip fixedly mounted on the island and having a bonding pad thereon, a lead terminal having an end disposed closely to the island, a bonding wire connecting the bonding pad to the lead terminal, and a molded resin body encasing the semiconductor chip and the bonding wire.

The bonding wire may include a first extension bonded to the bonding pad and ascending substantially vertically from the bonding pad to a predetermined height, a second extension extending from the first extension to a location near an end of the semiconductor chip substantially at the predetermined height, and a third extension descending from the second extension and bonded to the lead terminal.

The bonding wire may also include a first bend positioned upwardly of the bonding pad, a second bend positioned upwardly of an end of the semiconductor chip or between the end of the semiconductor chip and a bond by which the bonding wire is joined to the lead terminal, and a third bend positioned between the first bend and the second bend.

The third extension of the bonding wire extends downwardly at a large gradient toward the lead terminal, with the second bend being positioned upwardly of the end of the semiconductor chip. This arrangement is effective in reducing the distance between the end of the semiconductor chip and the bond by which the bonding wire is connected to the lead terminal. Consequently, a relatively large semiconductor chip may be accommodated in a package of the usual size. The second and third bends keep the bonding wire out of contact with a corner of the semiconductor chip. The height of the first extension can thus be reduced, and hence the thickness of the package can also be reduced.

The first and second bends have relatively large angles, thus preventing the bond by which the bonding wire is bonded to the bonding pad from suffering excessive stress. As a result, the bonding wire may have a relatively small loop height even if the bonding wire has a relatively large diameter. The semiconductor chip may have an increased chip size for an increased maximum rated output, and the bonding wire may be relatively thick for an increased current capacity to meet such an increased maximum rated output. The semiconductor chip of increased size and maximum rated output capability can be accommodated in a package of the usual size.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a cross-sectional view of a conventional semiconductor device;

FIG. 2 is a fragmentary cross-sectional view of a semiconductor device according to an embodiment of the present invention;

FIG. 5 is a perspective view of the semiconductor device shown in FIG. 2;

FIGS. 6A and 6B are views showing paths of a capillary tool;

FIGS. 7A through 7E are views illustrative of a wire bonding process;

DETAILED DESCRIPTION OF THE PREFERRED EMBODIMENTS

Figure 3:
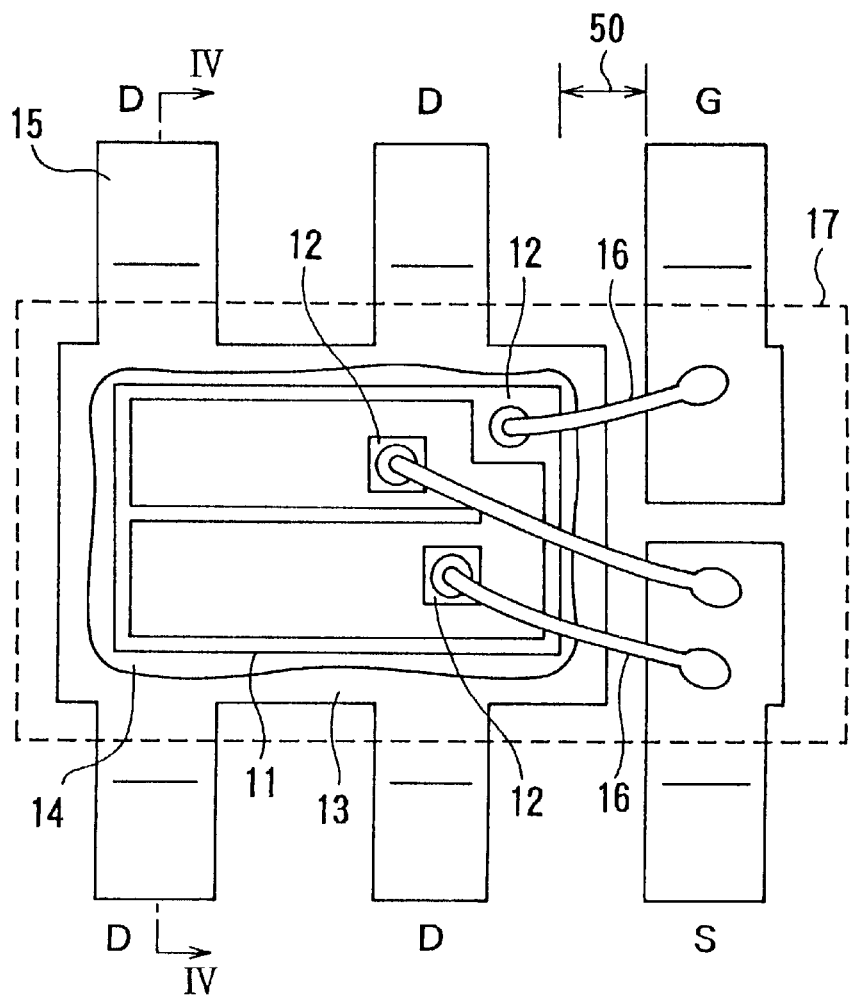
FIG. 3 is a plan view of the semiconductor device shown in FIG. 2.
Figure 4:
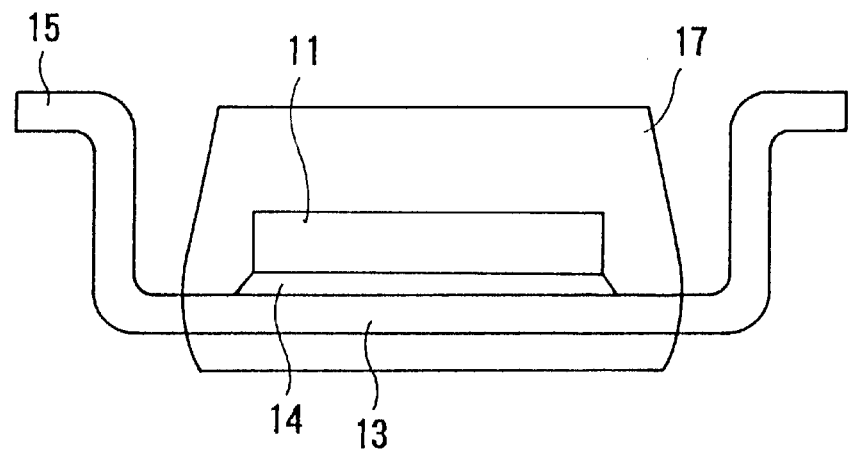
FIG. 4 is a cross-sectional view taken along line IV—IV of FIG. 3.
Figure 8A:
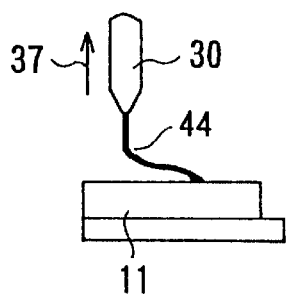
FIGS. 8A through 8G are views illustrative of a wire bonding process.
Figure 8B:
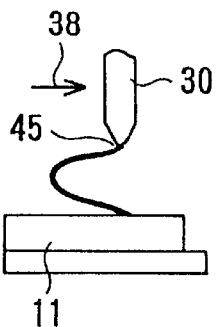
Figure 8C:
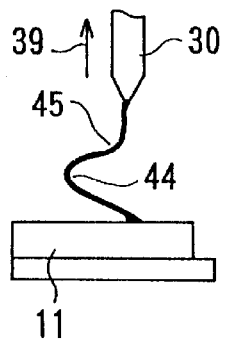
Figure 8D:
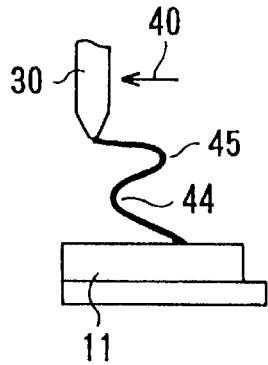
Figure 8E:
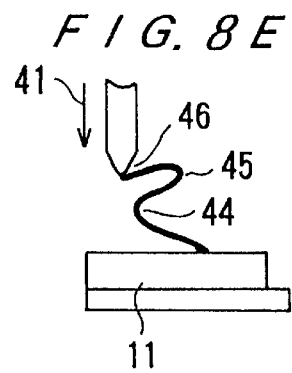
Figure 8F:
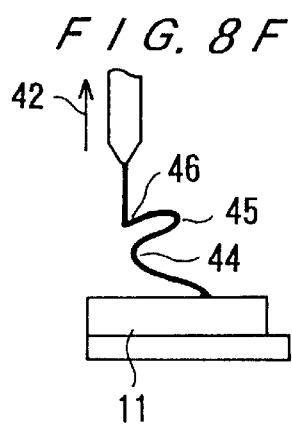
Figure 8G:
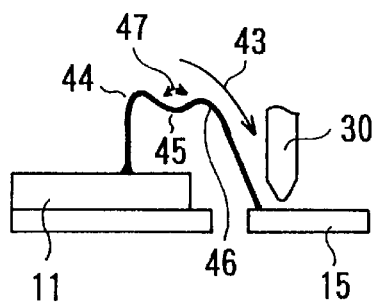

As shown in FIGS. 2 through 4, a semiconductor device according to an embodiment of the present invention includes a semiconductor chip 11 which may comprise an integrated circuit including discrete bipolar or MOS devices, various active and passage elements, etc. that are fabricated by forming various diffused regions of N type or P type in a silicon substrate and interconnections thereof. In the illustrated embodiment, the semiconductor device comprises a DSA power MOSFET device.

Bonding pads 12 for external connection are formed on a surface of the semiconductor chip 11. The bonding pads 12 have been formed by the process of forming the interconnections. A passivation film (not shown) such as a silicon nitride film, a silicon oxide film, or a polyimide film is disposed on the surface of the semiconductor chip 11 in covering relation to the bonding pads 12. The passivation film is selectively apertured above the bonding pads 12 for electric connections. In an integrated circuit, the bonding pads 12 would be disposed around the semiconductor chip 11. However, in a discrete device, the bonding pads 12 are often disposed nearly centrally on the semiconductor chip 11.

The semiconductor chip 11 is bonded to an island 13 of a lead frame by a conductive or insulative adhesive 14 such as an Ag paste having a film thickness ranging from 30 to 40 $\mu$m according to die bonding. The island 13 and lead terminals 15 are made of copper, iron, or alloy of copper and iron. The island 13 and the lead terminals 15 are formed to a desired pattern from a single sheet having a thickness ranging from 120 to 150 $\mu$m by blanking or etching. The island 13 and the lead terminals 15 are spaced from each other by a gap (about 150 $\mu$m) substantially equal to the thickness of the sheet from which the island 13 and the lead terminals 15 are formed. This gap has been required as a removal clearance at the time of fabricating the lead frame.

Bonding wires 16 comprising gold wires having a diameter ranging from 60 to 100 $\mu$m are connected by a first bond at one end to the respective bonding pads 12 and then connected by a second bond at the other end to ends (bonding areas) of the lead terminals 15 for external connection.

Major components including the semiconductor chip 11, the bonding areas of the lead terminals 15, and the bonding wires 16 are encased by a molded body 17 of thermosetting resin such as an epoxy resin, thus producing a package. The lead terminals 15 have opposite ends extending out of the package, and bent into a Z shape for a surface mount application in which the lead terminals 15 will face and be bonded to a conductive pattern on a printed-circuit board. In FIG. 3, the semiconductor device has six pins, four of which are integral with the island 13 as common drain terminals D and two of which are separate from the island 13 as gate and source terminals G, S, respectively.

According to the present invention, as shown in FIG. 2, each of the bonding wires 16 comprises a first extension 20 extending substantially vertically upwardly to a loop height t from a location where a gold ball 16a is pressed against and joined to the bonding pad 12, a second extension 21 extending horizontally from an upper end of the first extension 20 at the loop height t to a location near an end 26 of the semiconductor chip 11, and a third extension 22 extending downwardly at a large gradient from an outer end of the second extension 21 to a location where the third extension 22 is bonded to the lead terminal 15. A first bend 23 between the first and second extensions 20, 21 has an angle ranging from about 80 to 900, and a second bend 24 between the second and third extensions 21, 22 has an angle ranging from about 70 to 90°. The second extension 21 extending between the first and second bends 23, 24 has a third bend 25 in its intermediate portion. The third bend 25 serves to resist gravitational forces tending to cause the bonding wire 16 to fall in the vicinity of the second bend 24. The third bend 25 is formed as a result of the path of a capillary tool, as described later on. The third bend 25 has an angle ranging from about 100 to 180°, so that the second extension 21 extends substantially horizontally parallel to the surface of the semiconductor chip 11. The first bend 23 is positioned substantially directly upwardly of the bonding pad 12. The second bend 24 is positioned above a region near the chip end 26 or between the chip end 26 and the second bond by which the bonding wire 16 is joined to the lead terminal 15. The third bend 25 is positioned between the first and second bends 23, 24 above the semiconductor chip 11. Since the second bend 24 is positioned outwardly from near the chip end 26, the portion of the bonding wire 16 which extends from the second bend 24 to the second bond falls sharply downwardly at an angle θ (see FIG. 2) ranging from about 50 to 90° with respect to the horizontal plane of the island 13.

A conventional bonding wire is shown by the dotted lines in FIG. 2. A comparison between the bonding wire 16 and the conventional bonding wire clearly indicates that since the second bend 24 is positioned outwardly from near the chip end 26 and the angle θ of the third extension 22 is larger, the distance between the bonding wire 16 and the chip end 26 can be increased. Therefore, a distance 50 from the chip end 26 to the lead terminals 15 may be reduced to a value of at most 50μ, allowing the semiconductor chip 11 whose size is greater than the conventional chip size to be accommodated in the package.

Inasmuch as the bonding wires 16 and the semiconductor chip 11 are held out of contact with each other, the loop height t required to accommodate the semiconductor chip 11 which is of the same size as the conventional one can be reduced, and hence the thickness of the molded resin body 17 can also be reduced.

Increasing the size of the semiconductor chip 11 is primarily intended to increase the current capacity of the semiconductor device. If the current capacity of the semiconductor device is increased, it is necessary to increase the current capacity of the bonding wires 16 which carry currents, and to increase the diameter of the bonding wires 16. With the semiconductor device shown in FIG. 2, because the bonding wires 16 have a plurality of bends, the angles of the first and second bends 23, 24 may be smaller than about 100°, so that the bonding wires 16 themselves and the junctions between the bonding wires 16 and the bonding pads 12 are not subject to excessive stresses. The loop height t is not unnecessarily large since the curvature of the bends does not need to be very large even if the bonding wires 16 are large in diameter. With the loop height t being relatively small, the semiconductor chip 11 may be accommodated in a relatively low-profile package including the thickness of the molded body 17.

The inventors of the present application used bonding wires each having a diameter of 70μ with a loop height t of 0.26 mm, making it possible to mount a relatively large semiconductor chip having a chip size of 2.4×0.8 mm in a molded body 17 having outer longitudinal, transverse, and vertical dimensions of 2.8×1.5×0.9 mm. The thickness of a layer between the loop of the bonding wires 16 and the upper surface of the molded body 17 was 0.05 mm. The semiconductor chip thus accommodated in the molded body had a maximum rated output which was about 30% greater than the maximum rated output of a conventional semiconductor chip accommodated in a package of the same dimensions.

A process of manufacturing the semiconductor device according to the present invention will be described below. First, a suitable amount of conductive adhesive 14 is applied to the island 13 of the lead frame, and then the semiconductor chip 11 is fixed to the island 13 according to die bonding. Then, the lead frame with the semiconductor chip 11 fixed thereto is positioned and installed on the heating stage of a wire bonding apparatus. The bonding wires 16 are connected by first bonds to the bonding pads 12, and then connected by second bonds to the lead terminals 15 according to wire bonding (see FIG. 5). Then, major components including the semiconductor chip 11 and the bonding wires 16 are placed in a mold cavity defined between upper and lower mold members, and then a thermosetting resin such as an epoxy resin is injected into the mold cavity. After the injected resin is solidified, the molded package is removed from the mold cavity and severed from the lead frame. The lead terminals 15 are then shaped.

FIGS. 6A and 6B show the paths of a capillary tool 30 (see FIGS. 7A–7E) in the wire bonding process, and FIGS. 7A–7E and 8A–8G show the paths of the capillary tool 30 together with the bonding wire.

The path of the capillary tool 30 for forming the bonding wire shown in FIG. 1 and the path of the capillary tool 30 for forming the bonding wire shown in FIG. 2 will be described below for comparison.

For forming the bonding wire shown in FIG. 1, the capillary tool 30 is moved along the paths shown in FIGS. 6A and 7A–7E. Specifically, the wire 16 is inserted centrally through the capillary tool 30, and a gold ball 16a which is about 150μ across is formed on the tip end of the wire 16 by a torch flame or spark. The gold ball 16a is held against the surface of the bonding pad 12, and pressed and ultrasonically vibrated with heat by the capillary tool 30. In this manner, the gold ball 16a is joined to the surface of the bonding pad 12 by a first bond as shown in FIG. 7A. Then, the capillary tool 30 is elevated vertically in the direction indicated by the arrow 31 in FIGS. 6A and 7B. When the capillary tool 30 reaches a certain height, it is moved horizontally in the direction indicated by the arrow 32 in FIGS. 6A and 7C, thereby forming a bend 44 in the wire 16. Thereafter, the capillary tool 30 is moved upwardly in the direction indicated by the arrow 33 in FIGS. 6A and 7D. Then, the capillary tool 30 is moved obliquely downwardly in the direction indicated by the arrow 34 in FIGS. 6A and 7E, forming a loop in the wire 16. The capillary tool 30 presses a side wall of the wire 16 against the lead terminal 15 with its tip end while at the same time applying ultrasonic vibrations and heat to secure the wire 16 to the lead terminal 15 with a second bond. The distance that the capillary tool 30 moves upwardly in the direction indicated by the arrow 31 in FIG. 7B substantially determines the loop height t, and the bend 44 is positioned at the top of the loop of the wire 16.

For forming the bonding wire shown in FIG. 2, the capillary tool 30 is moved along the paths shown in FIGS. 6B and 8A–8G to form a plurality of bends in the wire 16. Specifically, after the wire 16 is joined to the semiconductor chip 11 by a first bond, the capillary tool 30 is moved in the directions indicated by the arrows 35, 36, 37 in FIGS. 6B and 8A. The arrows 35, 36, 37 correspond respectively to the arrows 31, 32, 33 shown in FIG. 6A. Thereafter, the capillary tool 30 is moved horizontally in the direction indicated by the arrow 38 in FIGS. 6B and 8B, thereby forming a bend 45 in the wire 16. Then, the capillary tool 30 is elevated vertically to a certain height in the direction indicated by the arrow 39 in FIGS. 6B and 8C, and subsequently moved horizontally in the direction indicated by the arrow 40 in FIGS. 6B and 8D. The capillary tool 30 is lowered vertically in the direction indicated by the arrow 41 in FIGS. 6B and 8E, additionally bending the wire 16 at the bend 45. The capillary tool 30 is lifted in the direction indicated by the arrow 42 in FIGS. 6B and 8F, forming a bend 46 in the wire 16. After the capillary tool 30 is lifted a certain distance, the wire 16 is gripped by a clamp and held in position, and the capillary tool 30 is moved obliquely downwardly in the direction indicated by the arrow 43 in FIGS. 6B and 8G, forming a loop in the wire 16. The capillary tool 30 then joins the wire 16 to the lead terminal 15 with a second bond. The bend 44 corresponds to the first bend 23, the bend 46 to the second bend 24, and the bend 45 to the third bend 25. The movement of the capillary tool 30 in the direction indicated by the arrow 35 produces the first extension 20 of the wire 16, the movement of the capillary tool 30 in the directions indicated by the arrows 37, 39 produces the second extension 20 of the wire 16, and the movement of the capillary tool 30 in the direction indicated by the arrow 42 produces the third extension 22 of the wire 16. While moving in the paths shown in FIGS. 7C and 7E and the paths shown in FIGS. 8B, 8D, 8E and 8G, the wire 16 is being gripped by the clamp and held in position. If the wire 16 has a diameter ranging from 60 to 100 μm, then the third bend 25 remains bent at an angle ranging from 100 to 170° as indicated by 47 in FIG. 8G due to the strength of the wire 16 after the bonding wire 16 has been bonded. If the wire 16 has a diameter ranging from 20 to 40 $\mu$m, then the third bend 25 is pulled to a substantially straight shape at about 180° by the capillary tool 30 as it moves.

By programming the movement of the capillary tool 30 to be effected along the paths shown in FIGS. 6B and 8A–8G, the bonding wire 16 can be shaped with the second bend 24 positioned outwardly from near the chip end 26 of the semiconductor chip 11.

Figure 9:
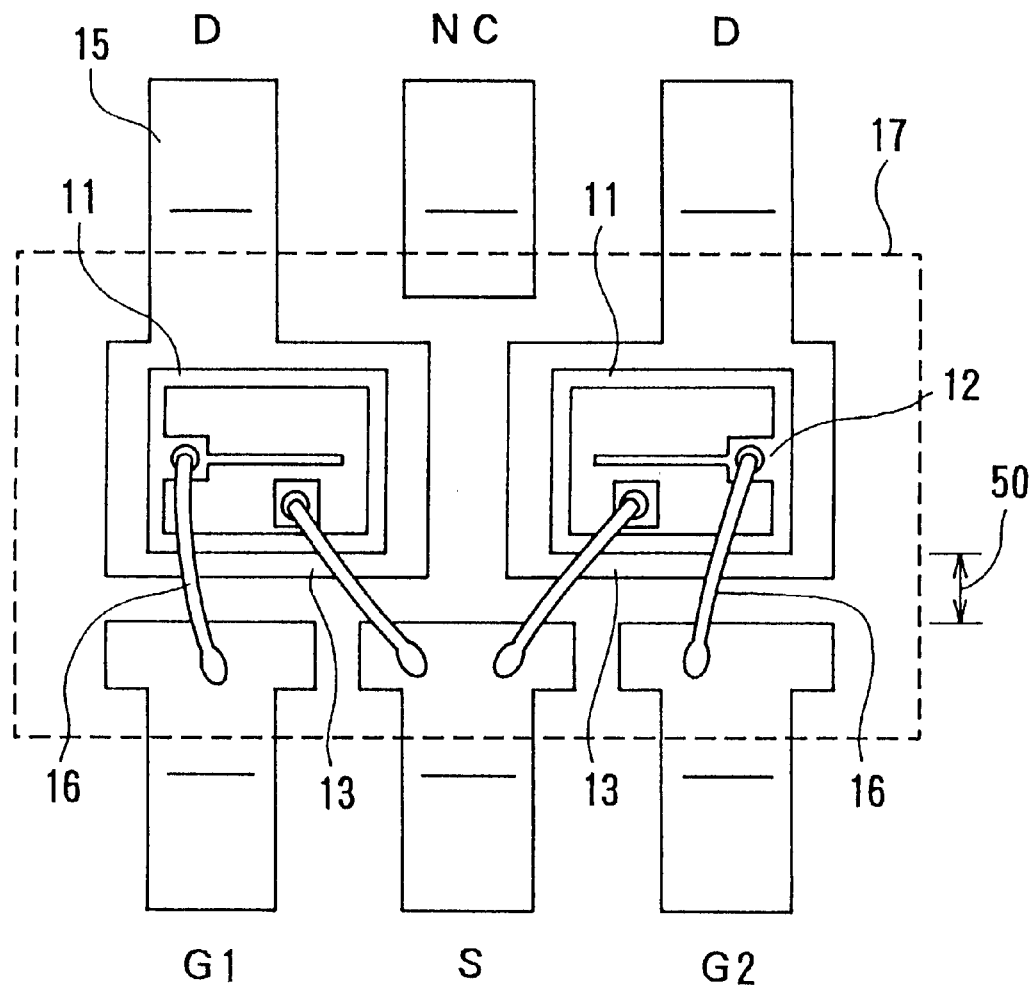
FIG. 9 is a plan view of a semiconductor device according to another embodiment of the present invention.

FIG. 9 shows in plan a semiconductor device according to another embodiment of the present invention. Those parts of the semiconductor device shown in FIG. 9 which are identical to those of the semiconductor device shown in FIG. 3 are denoted by identical reference characters, and will not be described below.

The semiconductor device according to the embodiment shown in FIG. 9 comprises a one-package dual-chip semiconductor device. The semiconductor device comprises two islands 13 and two identical semiconductor chips 11 which are accommodated in a package with six pins projecting therefrom. Each of the semiconductor chips 11 comprises a power MOSFET. The semiconductor chips 11 have respective sources connected to a common source terminal S, respective drains connected to respective drain terminals D, and respective gates connected to respective gate terminals G1, G2. Each of the bonding wires 16 is shaped as shown in FIG. 2 for thereby reducing the distance 50 between the semiconductor chips 11 and the bonding areas of the lead terminals 15. As a result, it is possible to accommodate larger semiconductor chips in packages of the usual size.

Although certain preferred embodiments of the present invention have been shown and described in detail, it should be understood that various changes and modifications may be made therein without departing from the scope of the appended claims.

What is claimed is:

1. A method of manufacturing a semiconductor device, comprising:
   preparing a lead frame having an island and a lead terminal;
   mounting a semiconductor chip fixedly on said island, said semiconductor chip having a bonding pad thereon;
   connecting a bonding wire to a bonding pad on said semiconductor chip and said lead terminal, said connecting comprising
      first, extending said bonding wire substantially vertically upwardly from said bonding pad to a first bend,
      second, extending said bonding wire substantially horizontally from said first bend to a second bend such that, between said first and second bends, said bonding wire extends slightly downwardly from said first bend toward a location between said first and second bends and extends slightly upwardly from said location toward said second bend to thereby form a third bend of a slightly downwardly bowed portion between the first and second bends, and
      third, extending said bonding wire to descend from said second bend to said lead terminal; and
   encasing said semiconductor chip and said bonding wire in a molded resin body;
   wherein in said extending of said bonding wire from said first bend to said second bend, said extending is carried out such that said second bend is positioned above a region near an end of said semiconductor chip.

2. A method of manufacturing a semiconductor device according to claim 1, wherein said bonding wire extends from said second bend to said lead terminal at an angle ranging from 50 to 90° with respect to a horizontal plane of said island.

3. A method of manufacturing a semiconductor device according to claim 1, wherein said first and second bends are at substantially the same height.

4. A method of manufacturing a semiconductor device according to claim 1,
   wherein said third bend is bent at an angle ranging from about 100 to 180°.

5. A method of manufacturing a semiconductor device according to claim 1, wherein said connecting is carried out by operating a capillary tool.

6. A method of manufacturing a semiconductor device according to claim 1, wherein said first bend is bent at an angle ranging from about 80° to 90°.

* * * * *